United States Patent
Scheibe

(10) Patent No.: US 8,963,635 B2
(45) Date of Patent: Feb. 24, 2015

(54) APPARATUS AND METHOD FOR PRODUCING SIGNALS CODED WITH AMPLITUDE SHIFT KEYING

(75) Inventor: Sven-Matthias Scheibe, Dresden (DE)

(73) Assignee: Endress + Hauser Conducta Gesellschaft fur Mess—und Regeltechnik mbH + Co. KG, Gerlingen (DE)

( * ) Notice: Subject to any disclaimer, the term of this patent is extended or adjusted under 35 U.S.C. 154(b) by 339 days.

(21) Appl. No.: 12/451,088

(22) PCT Filed: Apr. 24, 2008

(86) PCT No.: PCT/EP2008/055019
§ 371 (c)(1),
(2), (4) Date: Oct. 26, 2009

(87) PCT Pub. No.: WO2008/135402
PCT Pub. Date: Nov. 13, 2008

(65) Prior Publication Data
US 2010/0134199 A1    Jun. 3, 2010

(30) Foreign Application Priority Data
May 2, 2007 (DE) .......................... 10 2007 020 823

(51) Int. Cl.
H03F 3/217 (2006.01)
H03C 1/50 (2006.01)
H03C 1/36 (2006.01)

(52) U.S. Cl.
CPC .. *H03C 1/50* (2013.01); *H03C 1/36* (2013.01); *H03F 3/2176* (2013.01)
USPC ........... 330/251; 332/120; 332/145; 332/149; 332/175; 332/178; 333/24 R

(58) Field of Classification Search
CPC ........... H03F 3/2176; H03C 1/50; H03C 1/36
USPC ........ 332/120, 145, 149, 175, 178; 333/24 R; 330/251
See application file for complete search history.

(56) References Cited

U.S. PATENT DOCUMENTS 5,179,511 A * 1/1993 Troyk et al. ..................... 363/97
6,992,543 B2 * 1/2006 Luetzelschwab et al. ...... 333/32
(Continued)

FOREIGN PATENT DOCUMENTS

| EP | 1 475 886 | 11/2004 |
| EP | 1 480 156 | 11/2004 |

(Continued)

OTHER PUBLICATIONS

Author: Philip R. Troyk adn Marin A. K. Schwan Title: Closed-Loop Class E Transcutaneous Power and Data Link for MicroImplants Date: Jun. 1992 Publisher: IEEE Transactions on Biomedical Engineering vol. 39, No. 6 Pertinent pp. 589-599.*

(Continued)

*Primary Examiner* — Arnold Kinkead
*Assistant Examiner* — Richard Tan
(74) *Attorney, Agent, or Firm* — Bacon & Thomas, PLLC

(57) ABSTRACT

An apparatus for coding a signal by means of amplitude shift keying comprises a class E amplifier including a switching transistor, to whose gate is supplied a voltage having an operating frequency for operating the class E amplifier. For achieving an amplitude shift keying in the output signal of the class E amplifier, a circuit for switching the operating frequency of the voltage supplied to the gate of the switching transistor, or the resonance frequency of the class E amplifier, between a first value and a second value is provided and in order to switch a deviation degree between the operating frequency and the resonance frequency between a first value and a second value.

12 Claims, 3 Drawing Sheets

(56) References Cited

U.S. PATENT DOCUMENTS

| | | | |
|---|---|---|---|
| 7,202,734 B1 | 4/2007 | Raab | |
| 2005/0007237 A1* | 1/2005 | Meyer | 340/10.1 |

FOREIGN PATENT DOCUMENTS

| | | |
|---|---|---|
| EP | 1 580 879 | 9/2005 |
| EP | 1 691 481 | 8/2006 |
| WO | WO 2007/033972 | 3/2007 |

OTHER PUBLICATIONS

William H. Cantrell et al., Amplitude Modular Utilizing a High-Q Class-E DC-DC Converter, IEEE MTT-S International Microwave Symposium Digest 2003, Philadelphia, PA., pp. 1721-1724.

Raab, F.H., Electronically Tunable Class-E Power Amplifier, 2001 IEEE MTT-S International Microwave Symposium Digest, Phoenix, AZ., pp. 1513-1516.

* cited by examiner

APPARATUS AND METHOD FOR PRODUCING SIGNALS CODED WITH AMPLITUDE SHIFT KEYING

TECHNICAL FIELD

The present invention relates to an apparatus and a method for producing signals coded with amplitude shift keying, as well as to an apparatus for inductive transfer of signals coded with amplitude shift keying using the above apparatus.

BACKGROUND DISCUSSION

Apparatuses for amplitude shift keying in the state of the art involve a class E amplifier including a switching transistor, whose gate is operated at an operating frequency, and at least one variable resistor, which is switched as a function of a simulating input signal, in order to effect the amplitude modulation of the output signal of the class E amplifier.

Such an apparatus is disclosed, for example, in the published European application EP 1480156A2, wherein, in such case, a voltage having the operating frequency is supplied via a so-called tri state circuit to the gate of the switching transistor. The tri state circuit is a network of variable resistances, which sums as a function of the input signal voltages U1–U4 and supplies to the gate of the switching transistor. Corresponding to the variable gate voltage of the switching transistor, the output signal of the class E amplifier has differently large amplitude. Therewith, the described apparatus is suitable for coding by means of amplitude shifting, wherein the tri state circuit and its operation mean a certain amount of complexity, which should be avoided.

The company, Endress+Hauser, manufactures measuring devices under the mark MEMOSENS, in the case of which a sensor module is combined with an electronics module, which is fixedly connected with the sensor module and arranged in a plug head housing. The plug head housing forms the secondary side of an inductively coupling, plug connector coupling for transmission of data and energy. The primary side element of the plug connector coupling, which is connected via a cable via a measurement transmitter, contains an apparatus of the state of the art, wherein the amplitude shift keying occurs via the at least one variable resistor, which is implemented as a series connected, switchable load in the class E amplifier.

Although the described procedure basically functions and has proved itself in measurement operation, nevertheless the following improvement opportunities can be named:

First, for modulation, a load current is required, which is associated with efficiency losses;

Second, the degree of modulation is limited by the load resistance;

Third, overshooting of edges can occur in the circuit, caused by parasitic capacitances; and Fourth, extra components are required for the modulation, namely a switching transistor, a diode and three resistances.

SUMMARY OF THE INVENTION

It is, therefore, an object of the present invention to provide an apparatus for modulation through amplitude shift keying overcoming the disadvantages of the state of the art.

The object is achieved according to the invention by the apparatus for coding a signal by means of amplitude shift keying, comprising a class E amplifier including: a switching transistor, to whose gate a voltage is supplied with an operating frequency for operating the class E amplifier; and a circuit for switching the operating frequency of the voltage supplied to said gate of said switching transistor, or the resonance frequency, of said class E amplifier between a first value and a second value, in order to switch a deviation degree between the operating frequency and the resonance frequency between the first value and the second value; and is achieved by the method for coding a signal by amplitude shift keying, comprising steps of: operating the gate of a switching transistor of a class E amplifier having at least one operating frequency FT, wherein the class E amplifier has at least one resonance frequency FR; and switching in the clock rate of a data communication between a first deviation degree and a second deviation degree between the operating frequency FT and the resonance frequency FR, wherein: said switching of the deviation degree can occur by switching between two different operating frequencies, and/or by switching between two different resonance frequencies, of the class E amplifier.

The apparatus of the invention comprises a class E amplifier including a switching transistor, to whose gate a voltage is supplied with an operating frequency for operating the class E amplifier, characterized in that, for achieving an amplitude shift keying in the output signal of the class E amplifier, a circuit is provided for switching the operating frequency of the voltage (FT) supplied to the gate of the switching transistor, or the resonance frequency (FR), of the class E amplifier between a first value and a second value, in order to switch a deviation degree between the operating frequency and the resonance frequency between a first value and a second value. The deviation degree is defined as (FT−FR)/FR.

In a first embodiment of the invention, the switching between the different deviation degrees occurs by switching between two operating frequencies of the class E amplifier, wherein the switching occurs in the clock rate of the data communication.

It is currently preferable, that both operating frequencies lie above, or both operating frequencies lie below, the resonance frequency of the class E amplifier. This is advantageous, in order to prevent that in the case of fluctuations of the resonance frequency, the amplitude ratio of the output voltages of the first operating frequency and the second operating frequency might reverse.

In a second embodiment of the invention, the gate of the switching transistor is operated with a fixed operating frequency, wherein, for switching the deviation degree, the resonance frequency of the class E amplifier is altered by connecting in, or out, a frequency influencing component. The frequency influencing component can be, for example, a capacitance or an inductance, which is switched especially by means of a switching transistor.

The method of the invention for coding a signal by amplitude shift keying comprises the following steps:

Operating the gate of a switching transistor of a class E amplifier with at least one operating frequency FT, wherein the class E amplifier has at least one resonance frequency FR;

and switching in the clock rate of a data communication between a first deviation degree and a second deviation degree between the operating frequency FT and the resonance frequency FR, wherein the switching of the deviation degree can occur by switching between two different operating frequencies, and/or by switching between two different resonance frequencies, of the class E amplifier.

Finally, the invention comprises a primary side plug connector element of a plug connector coupling having the primary side plug connector element and a secondary side plug connector element, wherein the primary side plug connector element comprises an inductive transformer for transferring data and energy to the secondary side plug connector element, and the energy transmission occurs by means of an AC signal, which is coded for data transmission with amplitude shift keying, wherein, for amplitude shift keying, an apparatus of the invention is provided for producing signals coded with amplitude shift keying.

BRIEF DESCRIPTION OF THE DRAWINGS

The invention will now be explained on the basis of an example of an embodiment presented in the drawing, the figures of which show as follows.

DETAILED DISCUSSION IN CONJUNCTION WITH THE DRAWINGS

Figure 1:
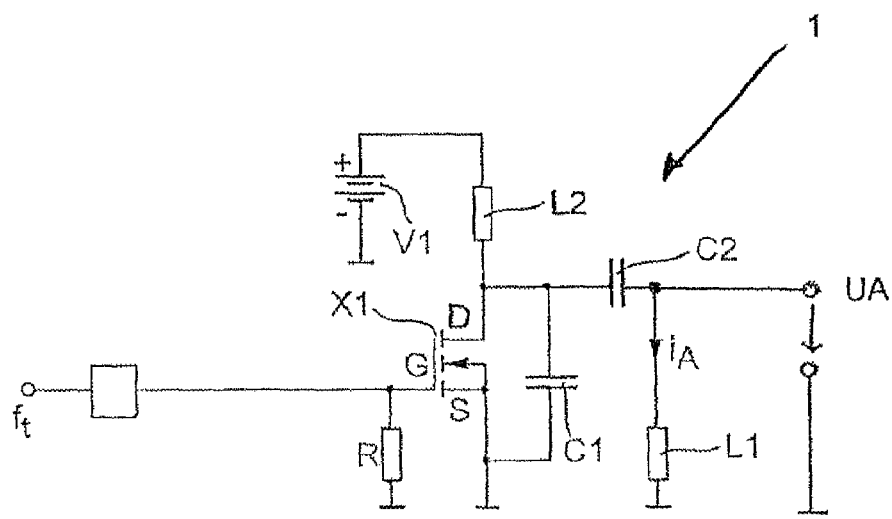
FIG. 1 is a circuit diagram of a modulating apparatus of the invention.

The apparatus shown in FIG. 1 comprises a class E amplifier, which is operated via a switching transistor X1, wherein the switching transistor X1 is especially a field effect transistor. The source connection S of the field effect transistor X1 lies at ground and is connected via a capacitance C1 with the drain connection D, wherein the supply voltage V1 is connected to the drain connection D via an inductor L2. The class E amplifier includes, furthermore, an inductor L1, which is connected via a capacitance C2 to the drain connection D of the field effect transistor X1, wherein the other inductor L1 lies at ground. The inductor L1 serves at the same time as transmitting antenna for out-coupling of the signal modulated with amplitude shift keying.

Figure 2:
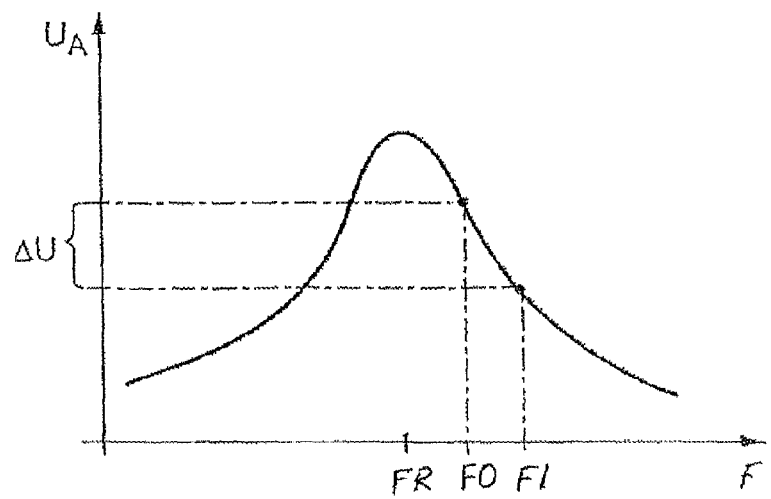
FIG. 2 is a diagram of frequency response for the class E amplifier of an apparatus of the invention for illustrating amplitude modulation through variation of the operating frequency FT.

For operating the class E amplifier, the gate connection G of the field effect transistor X1 is operated with an operating frequency FT. For implementing the amplitude shift keying, in the clock rate of the data transmission, a frequency shift between FT=F0 and FT=F1 is performed. As presented in FIG. 2, this effects an amplitude shift keying ΔU of the out-coupled reduction voltage UA. The operating frequency can, for example, assume the following values: F0=250 kHz, F1=285 kHz. Both F0 and, thus, also F1 lie above the resonance frequency FR of the class E amplifier. The deviation degree in the case of FT=F0 is thus (F0−FR)/FR and is sufficiently smaller than the deviation degree in the case of FT=F1, wherein the deviation degree is then (F1−FR)/FR.

Figure 3:
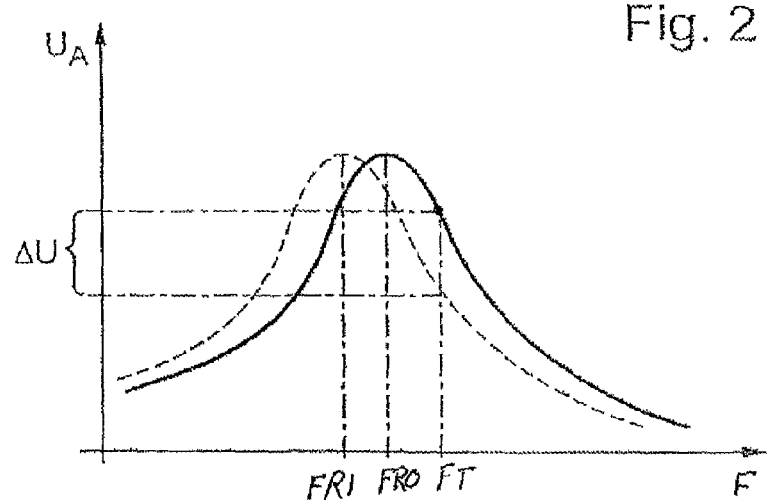
FIG. 3 is a diagram of frequency responses for the class E amplifier of a second example of an embodiment of an apparatus of the invention for illustrating amplitude shift keying by switching the resonance frequency FR.

FIG. 3 shows the principle of the amplitude shift keying by switching the deviation degree via change of the resonance frequency of the class E amplifier. For this, the capacitance C2 can be switchably embodied, for example, using two parallel connected capacitances, wherein one of the capacitances can be brought in or out via a switching transistor. This leads to a switchable resonance frequency of the class E amplifier between FR0 and FR1 and, associated therewith, in the case of unchanged operating frequency FT to a switchable deviation degree between (FT−FR0)/FR0 and (FT−FR1)/FR1.

Figure 4A:
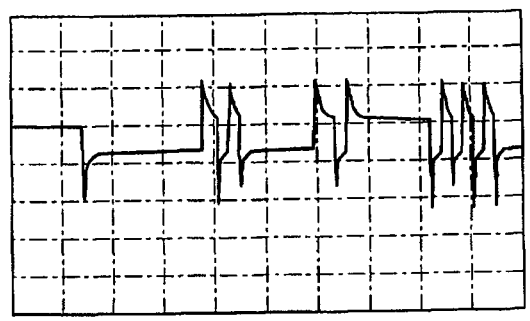
FIG. 4a is an oscilloscope recording for amplitude shift keying according to the state of the art by connecting in a load into the class E amplifier.
Figure 4B:
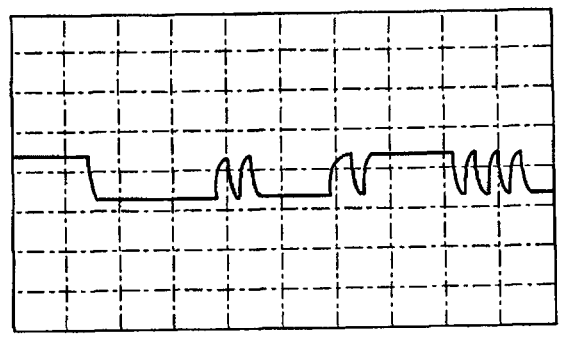
FIG. 4b is an oscilloscope recording for amplitude shift keying of the invention by switching the operating frequency of the class E amplifier.

The advantage of the amplitude shift keying according to the present invention, as compared to the state of the art, is, in closing, again presented on the basis of measurement data in FIGS. 4a and 4b.

FIG. 4a shows the curve of the output voltage UA of a class E amplifier for an amplitude shift keying according to the state of the art, wherein, in such case, a load can be switched in and out of the class E amplifier. Only a degree of modulation of about 10% is reached, and the signal includes overshooting edges, probably due to parasitic capacitances.

FIG. 4b shows, finally, the output signal of an amplitude shift keying of the invention through frequency shifting of the operating frequency of the class E amplifier, wherein a degree of modulation of about 23% is reached.

Figure 5:
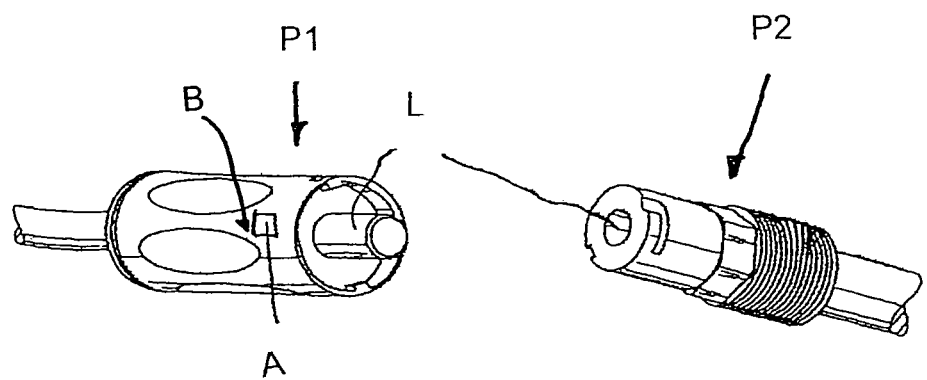
FIG. 5 illustrates in spaced apart relationship, a primary side plug connector and a secondary side plug connector.

FIG. 5 shows a primary side plug connector P1 of a plug connector coupling and a secondary side plug connector P2, wherein the primary side plug connector P1 comprises an inductive transformer L for transferring data and energy to the secondary side plug connector P2. The energy transmission occurs by means of an AC signal, which coded for data transmission with amplitude shift keying, wherein for amplitude shift keying, an apparatus A of the invention is provided for producing signals coded with amplitude shift keying. The apparatus A comprises the class E amplifier B.

In summary, essential advantages of the present invention are as follows. No load current, or no load resistance, is required; the degree of modulation depends on the operating frequencies, or the deviation degree and is, insofar, optimally selectable; the data coding is, by means of software, faster to change; and the edges of the output signals achieved through amplitude shift keying are steep and without overshooting. Furthermore, the tolerances of the components of the class E amplifier and their temperature drift can be cancelled by adapting the frequency. As a result, this enables a lessening of component complexity, especially for those components, which are used for modulation.

The invention claimed is:

1. An apparatus for coding an input signal by means of amplitude shift keying to an out-coupled reduction voltage resulting in a data transmission, comprising a class E amplifier having a resonance frequency (FR), including:
   a switching transistor, to whose gate a voltage is supplied with an operating frequency (FT) for operating the class E amplifier; and
   a circuit for switching the operating frequency (FT) of the voltage supplied to the gate of the switching transistor of said class E amplifier between a first operating frequency (F0) and a second operating frequency (F1), in order to switch a deviation degree, between the operating frequency (FT) and the resonance frequency (FR), between a first value and a second value, wherein:
   for implementing the amplitude shift keying, a frequency shift between the first operating frequency (F0) and the second operating frequency (F1) is performed in a clock rate of the data transmission, thus effecting the amplitude shift keying of the out-coupled reduction voltage.

2. The apparatus as claimed in claim 1, wherein:
   the first operating frequency (F0) and the second operating frequency (F1) lie above, or the first operating frequency (F0) and the second operating frequency (F1) lie below, the resonance frequency (FR) of the class E amplifier.

3. A primary side plug connector element of a plug connector coupling, which comprises:
 a primary side plug connector element and a secondary side plug connector element, wherein:
 said primary side plug connector element includes an inductive transformer for transferring data and energy to the secondary side plug connector element;
 an energy transmission occurs by means of an AC signal, which is coded for data transmission with amplitude shift keying; and
 for the amplitude shift keying, the apparatus as claimed in claim 1 for producing signals coded with the amplitude shift keying is provided, and the operating frequency of the class E amplifier is a frequency of the AC signal.

4. The apparatus as claimed in claim 1, wherein
 the deviation degree is defined as (FT−FR)/FR, wherein
 the first value of the deviation degree is defined as (F0−FR)/FR, and wherein
 the second value of the deviation degree is defined as (F1−FR)/FR.

5. A method for coding an input signal by amplitude shift keying to an out-coupled reduction voltage resulting in a data transmission, comprising a step of:
 supplying at least one operating frequency (FT) to a gate of a switching transistor of a class E amplifier, wherein the class E amplifier has at least one resonance frequency (FR); and
 switching a deviation degree between the operating frequency (FT) and the resonance frequency (FR), wherein:
 the deviation degree is defined as (FT−FR)/FR, and
 the switching of the deviation degree occurs by switching between a first operating frequency (FO) and a second operating frequency (F1) of the voltage supplied to the gate of the switching transistor, thus effecting an amplitude shift keying (ΔU) of the out-coupled reduction voltage (UA).

6. The method as claimed in claim 5, wherein the switching of the deviation degree occurs between a first value of the deviation and a second value of the deviation degree, wherein the first value of the deviation degree is defined as (F0−FR)/FR, and wherein the second value of the deviation degree is defined as (F1−FR)/FR.

7. An apparatus for coding an input signal by means of amplitude shift keying to an out-coupled reduction voltage resulting in a data transmission, comprising a class E amplifier having a resonance frequency, including:
 a switching transistor, to whose gate a voltage is supplied with an operating frequency for operating the class E amplifier; and
 a circuit for switching the resonance frequency of said class E amplifier between a first resonance frequency and a second resonance frequency, in order to switch a deviation degree, between the operating frequency and the resonance frequency, between a first value and a second value, wherein:
 said gate of the switching transistor is operated with a fixed operating frequency, and, for switching the deviation degree, the resonance frequency of the class E amplifier is altered from the first resonance frequency to the second resonance frequency by connecting in, or out, a frequency influencing component.

8. The apparatus as claimed in claim 7, wherein said frequency influencing component comprises a switchable capacitor.

9. The apparatus as claimed in claim 7, wherein said frequency influencing component comprises a coil.

10. The apparatus as claimed in claim 7, wherein
 the deviation degree is defined as (FT−FR)/FR, wherein
 the first value of the deviation degree is defined as (FT−FR0)/FR0, and wherein
 the second value of the deviation degree is defined as (FT−FR1)/FR1.

11. A method for coding an input signal by amplitude shift keying to an out-coupled reduction voltage resulting in a data transmission, comprising a step of:
 supplying at least one operating frequency (FT) to a gate of a switching transistor of a class E amplifier, wherein the class E amplifier has at least one resonance frequency (FR); and
 switching a deviation degree between the operating frequency (FT) and the resonance frequency (FR), wherein:
 the deviation degree is defined as (FT−FR)/FR, and
 the switching of the deviation degree occurs by switching between a first resonance frequency (FR0) and a second resonance frequency (FR1) of the class E amplifier.

12. The method as claimed in claim 11, wherein the switching of the deviation degree occurs between a first value of the deviation and a second value of the deviation degree, wherein the first value of the deviation degree is defined as (FT−FR0)/FR0, and wherein the second value of the deviation degree is defined as (FT−FR1)/FR1.

\* \* \* \* \*